United States Patent
Kitamura

[19]

[11] Patent Number: 6,141,477
[45] Date of Patent: Oct. 31, 2000

[54] SEMICONDUCTOR OPTICAL AMPLIFICATION ELEMENT

[75] Inventor: Shotaro Kitamura, Tokyo, Japan

[73] Assignee: NEC Corporation, Tokyo, Japan

[21] Appl. No.: 09/003,152

[22] Filed: Jan. 6, 1998

[30] Foreign Application Priority Data

Jan. 10, 1997 [JP] Japan .................................... 9-002940

[51] Int. Cl.$^7$ ....................................................... G02B 6/10
[52] U.S. Cl. .............................................. 385/131; 372/45
[58] Field of Search ................................. 372/31, 48, 49, 372/20, 45, 50; 359/341, 344, 347, 339, 346, 345, 187, 194, 239, 114, 124

[56] References Cited

U.S. PATENT DOCUMENTS

| | | | |
|---|---|---|---|
| 4,954,786 | 9/1990 | Yamakawa et al. | 359/341 |
| 5,015,964 | 5/1991 | O'Mahony | 359/347 |
| 5,184,247 | 2/1993 | Schimpe | 359/344 |
| 5,202,791 | 4/1993 | Kaede | 359/345 |
| 5,566,018 | 10/1996 | Lee et al. | 359/341 |

FOREIGN PATENT DOCUMENTS

| | | |
|---|---|---|
| 60-15986 | 1/1985 | Japan . |
| 61-96787 | 5/1986 | Japan . |
| 1-186695 | 7/1989 | Japan . |
| 2-226233 | 9/1989 | Japan . |
| 7-193330 | 9/1989 | Japan . |
| 2-248097 | 10/1990 | Japan . |
| 3-44988 | 2/1991 | Japan . |
| 3-136388 | 6/1991 | Japan . |
| 4-9824 | 1/1992 | Japan . |
| 4-179179 | 6/1992 | Japan . |
| 5-27130 | 2/1993 | Japan . |
| 5-142590 | 6/1993 | Japan . |
| 5-175611 | 7/1993 | Japan . |
| 2-263233 | 7/1995 | Japan . |
| 10-300959 | 11/1998 | Japan . |

OTHER PUBLICATIONS

I. Cha et al., "1–5 μm Band Travelling–Wave Semiconductor Optical Amplifiers with Window Facet Structure", *Electronics Letters*, vol. 25, No. 18, Aug. 1989, pp. 1241–1242.

C.E. Zah et al, "Fabrication and Performance of 1–5 μm GaInAsP Travelling–Wave Laser Amplifiers with Angled Facets", *Electronics Letters*, vol. 23, No. 19, Sep. 10, 1987, pp. 990–991.

L.F. Tiemeijer et al., "Progress in 1.3 μm Polarization Insensitive Multiple Quantum Well Laser Amplifiers", *OAA '94 Technical Digest*, 1994, pp. 34/WD1–1–36/WD1–3.

P. Doussiere et al., "1550 nm Polarization Independent DBR Gain Clamped SOA with High Dynamic Input Power Range", *22nd European Conf. on Optical Comm.—ECOC '96, Oslo*, 1996, pp. WeD.2.4, pp. 169–172.

P. Doussiere et al., "1.55 μm Polarisation Independent Semiconductor Optical Amplifier with 25 dB Fiber Gain", *IEEE Photonics Technology Letters*, vol. 6, No. 2, Feb. 1994, pp. 170–172.

S. Chelles et al., "Polarization Insensitive Wavelength Conversion By Cross Gain Modulation In A Strained MQW Optical Amplifier", *22nd European Conf. on Opt. Comm.—ECOC '96*, Oslo, pp. 4. 53–4. 56.

L.F. Tiemeijer et al., "Improved Selectvity and Decreased Spontaneous Emission from an AR–HR Coated SL–MQW DFB Semiconductor Laser Amplifier", *IEEE Photonics Technology Letters*, vol. 6, No. 2, Feb. 1994, pp. 179–181.

Hideko Ishio, ed., "Light Amplifiers and Their Applications", First Edition, Ohmusha, May 1992, pp. 60–66.

*Primary Examiner*—Akm E. Ullah
*Attorney, Agent, or Firm*—Sughrue, Mion, Zinn, Macpeak & Seas, PLLC

[57] ABSTRACT

The invention provides a semiconductor optical amplification element which reduces noise light emission and increases saturation output power. The semiconductor optical amplification element has an optical waveguide which includes a core layer formed from an active layer acting as an optical amplification medium and amplifies and outputs an optical signal without electrically converting. The light reflection factor on an inputting side end of the element for the optical signal is lower than the light reflection factor on another outputting side end of the element.

17 Claims, 8 Drawing Sheets

SEMICONDUCTOR OPTICAL AMPLIFICATION ELEMENT

BACKGROUND OF THE INVENTION

1. Field of the Invention

This invention relates to a semiconductor optical amplification element for use with optical communication, and more particularly to a semiconductor optical amplification element which has an optical signal amplification function or an optical signal quenching function.

2. Description of the Related Art

A semiconductor optical amplification element (hereinafter referred to as optical amplifier) is an element which has an optical amplification medium of the striped optical waveguide type and amplifies an optical signal without electrically converting it. While the optical amplifier has a basic structure common to that of a semiconductor laser, an anti-reflecting coating or the like is applied to each end of the element to suppress the light reflection factor at the end so that the optical amplifier may have no optical resonator structure. By such suppression of the light reflection factor, laser oscillation of the optical amplifier itself when carriers are injected is suppressed and amplified light is outputted by stimulated emission by input signal light.

Since the reflection factor at each end of the element is usually required to be lower than 0.1%, in addition to an anti-reflecting coating applied to each end of the element, a structure which prevents reflected light from each end facet of the element from being recoupled to the optical waveguide is adopted in order to effectively lower the reflection factor at the end of the element.

One of methods of lowering the effective reflection factor at each end of the element is to provide a window region for allowing the optical waveguide structure to be terminated in the proximity of the end facet of the element. Several structures which involve provision of such a window region as described above have been reported, and, for example, the following documents (1) to (3) disclose such structures:

(1) Japanese Patent Laid-Open Application No. Showa 61-96787

(2) P. Doussiere et al., *J. Photonicis Technol.* Lett., PTL-6, pp.170–172 (1994)

(3) I. Cha et al., *Electr. Lett.*, Vol. 25, pp.1242–1242 (1989)

Also another method wherein the direction of stripes of the optical waveguide is inclined from the direction of a normal to an end facet of the element is known and disclosed, for example, in the following documents (4) and (5):

(4) C. E. Zah et al., *Electr. Lett.*, Vol. 23, pp.990–991 (1987)

(5) Japanese Patent Laid-Open Application No. Heisei 3-136388

In recent years, several further methods which adopt both of the structures of a window region and inclined stripes have been proposed and are disclosed, for example, in the following documents (6) to (8):

(6) L. F. Tiemeijer, *OAA '94 Technical Digest*, 34/WD1-1 (1994)

(7) P. Doussiere et al., *ECOC '96, Proceeding*, Vol. 3, WeD.2.4 (1996)

(8) S. Chelles et al., *ECOC '96, Proceeding*, Vol. 4, ThB.2.5 (1996)

By such various measures as described above, under the preset conditions, an element gain of 30 dB and an amplified signal light saturation output of approximately 10 dBm are realized. While residual light reflection at an end of the element produces gain oscillations (ripple) by wavelength dependency at distances of several angstrom, also such ripple is commonly suppressed lower than 1 dB. Further, an S/N ratio deterioration amount of 5 to 7 dB by noise light carried on a signal upon optical amplification is obtained. The S/N ratio deterioration amount is called "noise figure" and desired to be as small as possible and is determined by an element structure and a current injection amount.

One of devices competent with an optical amplifier of a semiconductor is an optical amplifier in the form of a rare earth element doped fiber (fiber optical amplifier). A fiber optical amplifier having a gain higher than 30 dB, a saturation output higher than 15 dBm and a noise figure of approximately 4 dB has been reported.

While an optical amplifier of a semiconductor is less advantageous in gain characteristic than a fiber optical amplifier as described above, it is advantageous in that it is compact, less expensive and low in power consumption and allows integration. However, further output increase in output and reduction in noise are expected.

With an optical amplifier, although laser oscillation is suppressed by reduction in reflection factor at each end facet of the element, amplified spontaneous emission light (ASE light) is emitted. The amplified spontaneous emission light makes noise light, and in order to reduce noise light to the outputting side, reduction of the amplified spontaneous emission light is desired.

Further, S/N ratio deterioration of signal light is caused also by gain saturation in an optical amplifier. Therefore, improvement in saturation output is desired.

SUMMARY OF THE INVENTION

It is an object of the present invention to provide a semiconductor optical amplification element (optical amplifier) which is reduced in noise light and is improved in saturation output.

In order to attain the object described above, according to the present invention, there is provided a semiconductor optical amplification element having an optical waveguide which includes a core layer formed from an active layer acting as an optical amplification medium and amplifies an optical signal without electrically converting wherein a light reflection factor on an inputting side end for an optical signal is lower than a light reflection factor on an outputting side end.

In this instance, the light reflection factor at the end of the element on the optical signal inputting side may be lower than $\frac{1}{100}$ the light reflection factor at the end of the element on the outputting side.

When current is injected into an optical amplifier, amplified spontaneous emission light (ASE light) is emitted. The ASE light makes noise light, and the ratio between the inputting and outputting side ASE light emissions by the noise light is represented by the following expression (1):

$$I_{in}/I_{out} = (1-R_{in})/(1-R_{out}) \times (1+R_{out}G)/(1+R_{in}G) \quad (1)$$

where $I_{in}$ and $I_{out}$ are the inputting side ASE light emission and the outputting side ASE light emission, respectively, $R_{in}$ and $R_{out}$ are the reflection factors on the inputting side and the outputting side, respectively, and G is the element gain.

Accordingly, if the inputting side reflection factor $R_{in}$ is set relatively lower than the outputting side reflection factor $R_{out}$, then the ASE light emission $I_{out}$ to the outputting side can be suppressed. Meanwhile, a ripple of the gain which arises from residual reflection at the end of the element is represented by:

$$\text{rip} = (1 + G \cdot (R_{in} \cdot R_{out})^{1/2})^2 / (1 - G \cdot (R_{in} \cdot R_{out})^{1/2})^2 \quad (2)$$

Consequently, $(R_{in} \cdot R_{out})^{1/2}$ must be suppressed sufficiently low. The countermeasure to the ripple is such as described above. In order to suppress noise light (ASE light) emission to the outputting side, $R_{in} \ll R_{out}$ should be satisfied under the condition that $(R_{in} \cdot R_{out})^{1/2}$ be suppressed sufficiently low. For example, if $I_{in}/I_{out} > 2$ and rip<1 dB are required, then $R_{in}$ and $R_{out}$ should be set as in Table 1 below in accordance with the magnitude of the gain G:

TABLE 1

|   | $R_{out}$ | $R_{in}$ |
|---|---|---|
| G = 5 dB | 0.3 or more | 0.001 or less |
| G = 10 dB | 0.1 or more | 0.0003 or less |
| G = 20 dB | 0.01 or more | $3 \times 10^{-5}$ or less |
| G = 30 dB | 0.001 or more | $3 \times 10^{-6}$ or less |

As described above, in order to sufficiently suppress the gain ripple, if $R_{in}$ is set to approximately $1/100$ $R_{out}$ or less under the condition that $(R_{in} \cdot R_{out})$ is made sufficiently low, then emission of ASE light, which makes noise light, to the outputting side can be suppressed sufficiently.

Further, in this instance, since the light intensity distribution on the outputting side in the element becomes weak, the injected electric carrier concentration on the outputting side becomes high. This brings about improvement in saturation output of amplified signal light. To signal light which is intensity amplified as it advances from the inputting side to the outputting side, as the carrier concentration on the outputting side becomes high, a higher output is obtained.

In order to realize the light reflection factor mentioned above, the semiconductor optical amplification element may be constructed such that the optical waveguide is a striped optical waveguide and is formed in an inclined relationship from a direction of a normal to an end facet of the element and besides has, in the proximity of the opposite ends of the element, window regions in which the optical waveguide structure is terminated, and the window region on the optical signal inputting side is longer by more than 20 μm than the window region on the optical signal outputting side.

As an alternative, the semiconductor optical amplification element may be constructed such that the optical waveguide is a striped optical waveguide and is formed in parallel or in an inclined relationship to a direction of a normal to an end facet of the element, and an anti-reflecting coating is provided only on the end facet of the element on the optical signal inputting side.

As another alternative, the semiconductor optical amplification element may have a window region, in which the optical waveguide structure is terminated, only in the proximity of the end of the element on the optical signal inputting side.

As a further alternative, the semiconductor optical amplification element may be constructed such that the optical waveguide has a partial curved portion formed thereon such that an emitting direction of light by current injection light emission is inclined from a direction of a normal to an end facet of the element on the optical signal inputting side, but not inclined on the optical signal outputting side.

As a still further alternative, the semiconductor optical amplification element may be constructed such that the optical waveguide has partial curved portions formed thereon such that an emitting direction of light by current injection light emission is inclined from a direction of a normal to each end facet of the element and the inclination on the optical signal inputting side is larger than that on the optical signal outputting side.

As a yet further alternative, the semiconductor optical amplification element may be constructed such that the optical waveguide whose core layer is formed from an active layer is a striped optical waveguide and passive optical waveguides are additionally provided for the opposite ends of the optical waveguide, and the passive optical waveguide on the optical signal inputting side has a partial curved portion formed thereon such that an emitting direction of light by current injection light emission is inclined from a direction of a normal to an end facet of the element only on the optical signal inputting side.

As a yet further alternative, the semiconductor optical amplification element may be constructed such that the optical waveguide whose core layer is formed from an active layer is a striped optical waveguide and passive optical waveguides are additionally provided for the opposite ends of the optical waveguide, and the passive optical waveguide on the optical signal inputting side has a partial curved portion formed thereon such that an emitting direction of light by current injection light emission is inclined from a direction of a normal to each end facet of the element and the inclination on the optical signal inputting side is larger than that on the optical signal outputting side.

As a yet further alternative, the semiconductor optical amplification element may be constructed such that a grating structure for causing reflection of light to occur is formed only on the optical signal outputting side.

The semiconductor optical amplification element of the present invention is advantageous, when compared with a conventional optical amplifier wherein the reflection factor is suppressed equally on both of the inputting and outputting sides, in that it can achieve a higher saturation output of signal light and a lower noise figure.

The above and other objects, features and advantages of the present invention will become apparent from the following description and the appended claims, taken in conjunction with the accompanying drawings in which like parts or elements are denoted by like reference characters.

DESCRIPTION OF THE PREFERRED
EMBODIMENTS

Embodiment 1

Figure 1:
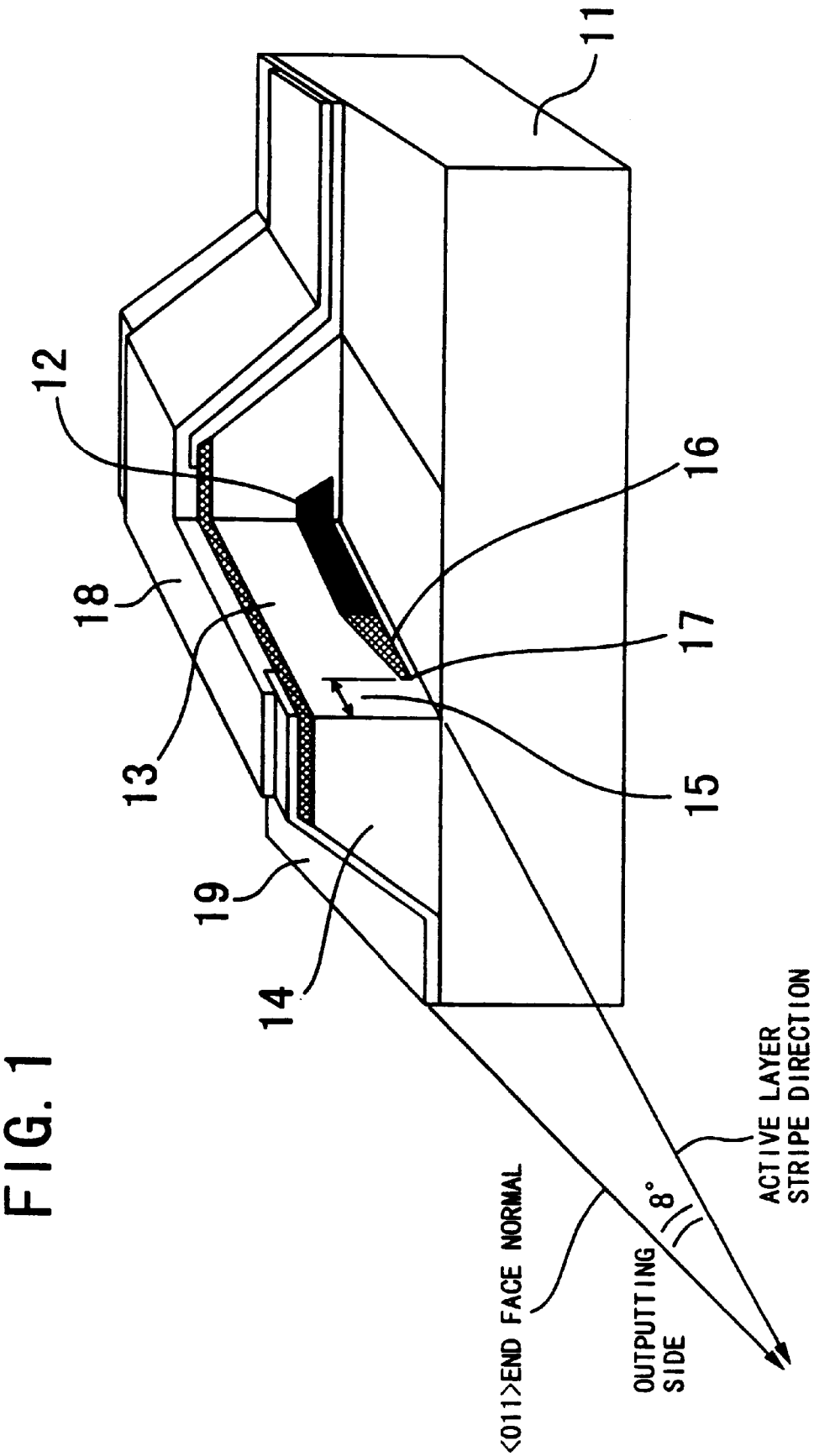
FIG. 1 is a perspective view showing a detailed structure of an optical amplifier to which the present invention is applied.

Referring first to FIG. 1, there is shown in perspective view a detailed structure of an optical amplifier to which the present invention is applied.

The optical amplifier is formed on an InP substrate 11 having an inputting side end facet and an outputting side end facet spaced by 1,100 μm from each other and has an ordinary buried heterostructure type (BH type) LD (laser diode) structure wherein an active layer 12 of a 1.55 µm band in wavelength is embedded in a clad layer 13.

The optical amplifier includes an optical waveguide in the form of a striped optical waveguide which is formed in an inclined relationship from the direction of a normal to an end facet of the element and besides has, in the proximity of the opposite ends of the element, window regions in which the optical waveguide structure is terminated. The window region (not shown) on the optical signal inputting side is longer by more than 20 µm than the window region 15 on the optical signal outputting side. The optical amplifier has an oblique end facet structure wherein the direction of stripes of the active layer 12 is inclined by 8 degrees from a normal to the end facet 14, and is constructed such that the active layer 12 is terminated by the window region 15 in the proximity of the end facet 14. A taper structure 16 wherein the thickness gradually decreases toward a tip (3,000 angstrom to 500 angstrom) thereof is formed over the length of 200 µm at the both ends of the active layer 12. In FIG. 1, reference numeral 18 denotes an electrode, and 19 a passivation film.

By the taper structure 16 described above, light reflection caused by a difference in reflection factor between the active layer 12 and the window region 15 is suppressed, and a light spot size at an optical waveguide tip 17 is expanded. By expanding the light spot size, a structure for small divergence of the emitted light beam is realized.

Figure 2:
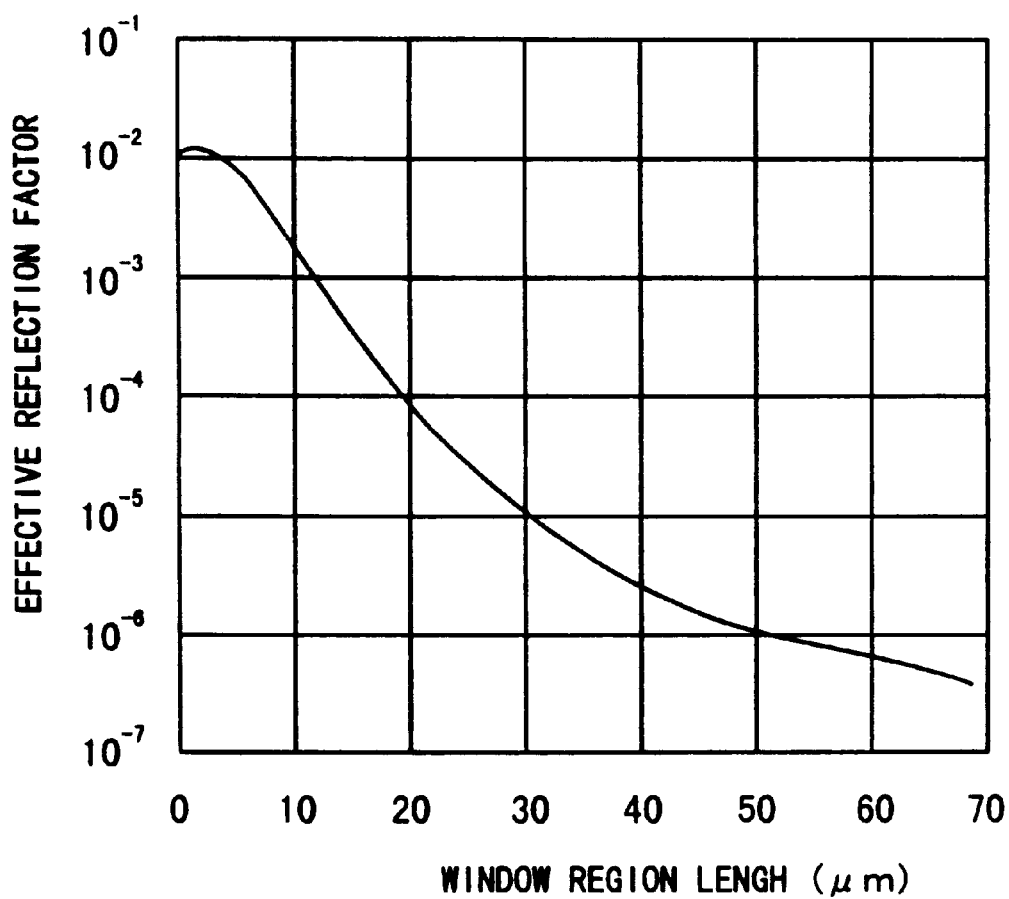
FIG. 2 shows a relationship between a window region length and a reflection factor of the optical amplifier of FIG. 1.

The optical amplifier is characterized in that the lengths of the window regions 15 at the inputting side and the outputting side are different from each other, and the length of the window region 15 on the outputting side is 10 µm while the length of the window region of the inputting side is 70 µm. By forming the window regions 15 longer, the effective reflection factor is more reduced.

Where the oblique end facet structure is employed, reduction in reflection factor by elongating the window regions becomes remarkable where the emission beam divergence decreases. FIG. 2 shows a window region length dependency of the effective reflection factor where the (1/e) light spot field radius of glided wave light at the end of the optical waveguide on the optical amplifier side is expanded as 2.5 µm. This spot radius is of the case with the above described taper structure 16.

On the background described above, the effective reflection factors on the outputting side and the inputting side of the optical amplifier are approximately 0.1% and 0.001%, respectively.

An optical amplifier having the construction described above was produced. When current of 150 mA was injected into the optical amplifier thus produced, an element gain of approximately 30 dB was obtained without depending upon input light polarization.

Meanwhile, separately from the optical amplifier, an element which has a structure same as that of the optical amplifier of the present embodiment and wherein the window regions 15 on the opposite sides are 30 µm long and an anti-reflecting coating of a SiON single layer film is applied to both of the end facets on the inputting and outputting sides was prepared for comparison.

The saturation output of the optical amplifier having the construction of the present embodiment was more than +7 dBm when current of 150 mA was injected, and this value thus obtained is higher by more than 3 dB than that of the amplifier for comparison. In this instance, the noise figure of the optical amplifier of the present embodiment exhibited a value lower than 6 dB, and this value thus obtained is lower by more than 1 dB than that of the amplifier for comparison.

Embodiment 2

Figure 3:
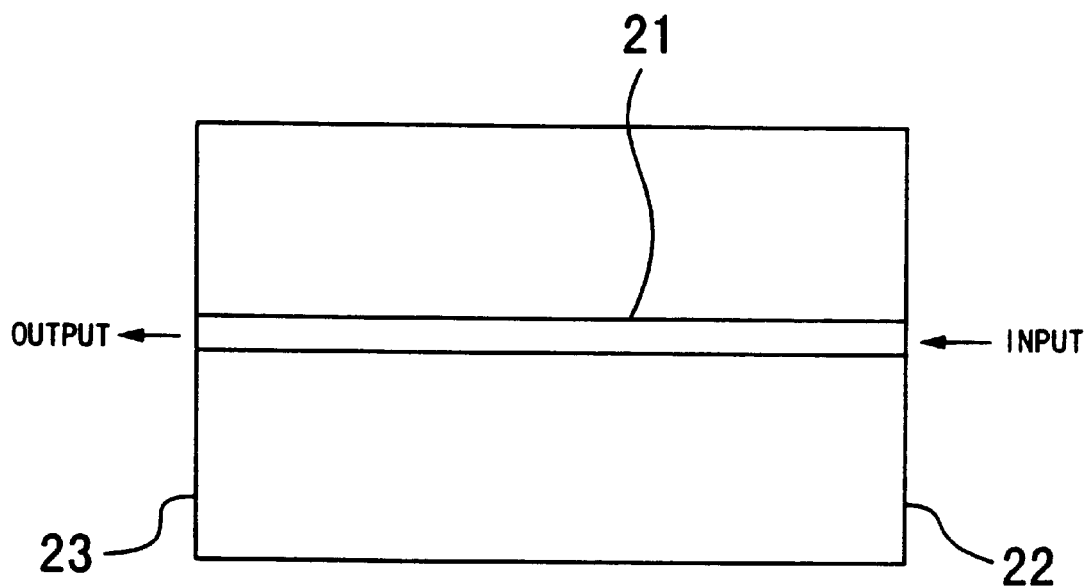
FIGS. 3 to 7 are top plan views showing different optical amplifiers to which the present invention is applied.

FIG. 3 is a top plan view showing another optical amplifier to which the present invention is applied. In the present embodiment, the optical waveguide is a striped optical waveguide and an anti-reflecting coating is applied only to the end facet of the element on the optical signal inputting side.

The sectional structure of the present optical amplifier is an ordinary BH type LD structure which is same as that of the optical amplifier of the first embodiment shown in FIG. 1. An active layer 21 is formed between end facets 22 and 23 of the element which are opposed to each other with a distance of 300 µm left therebetween and has a longitudinal direction substantially perpendicular to the end facets of the element, and no window region is formed thereon.

In the optical amplifier, the end facet 22 side serves as an inputting side while the end facet 23 side serves as an outputting side, and a anti-reflecting coating (AR coat) is applied only to the end facet 22. The AR coat is a film formed from two layers of $TiO_2/SiO_2$, and due to the AR coat, the reflection factor at the end facet 22 is estimated to be 0.1%. The reflection factor of the end facet 23 which is a cleave facet on which no AR coat is applied is 30%.

The optical amplifier of the present embodiment is inserted in an optical signal path and exhibits a function of an optical gate for signal passage/interruption, and the AR coat side serves as the inputting side. An optical amplifier having the construction of the present embodiment was produced. When current of 20 mA was injected into the optical amplifier thus produced, an element gain of approximately 5 dB was obtained without depending upon input light polarization.

Meanwhile, an element which has a structure same as that of the optical amplifier of the present embodiment and has AR coats applied to both of the opposite end facets was prepared for comparison. The noise figures of the optical amplifiers were measured. The measurement reveals that the noise figure of the optical amplifier of the present embodiment exhibited a value lower than 6 dBm, and the value thus obtained is lower by more than 1 dB than that of the amplifier for comparison.

Embodiment 3

Figure 4:
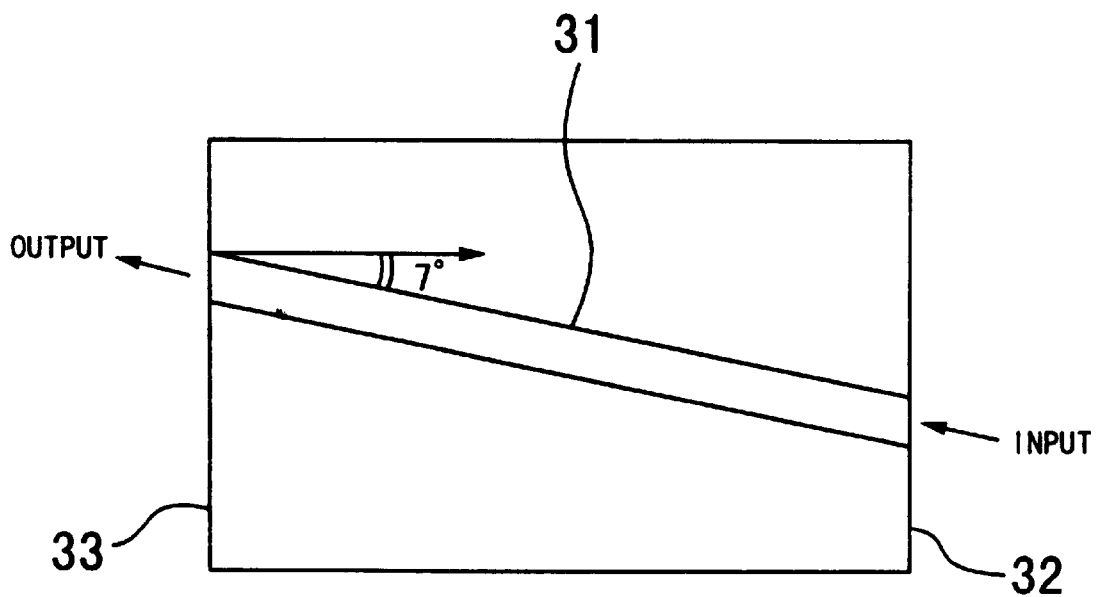

FIG. 4 is a top plan view showing a further optical amplifier to which the present invention is applied. Also in the present optical amplifier, an anti-reflecting coating is applied to only the end facet of the element on the optical signal inputting side similarly as in the optical amplifier shown in FIG. 3.

The present optical amplifier has an oblique end facet structure wherein an active layer 31 formed between end facets 32 and 33 of the element which are opposed to each other with a distance of 500 µm left therebetween has a longitudinal direction inclined by 7 degrees from the direction of a normal to an end facet of the element as seen in FIG. 4 and no window region is formed thereon. The sectional structure of the present optical amplifier is a BH type LD structure same as that of the optical amplifier shown in FIG. 1, and an AR coat which is a film formed from two layers of $TiO_2/SiO_2$ is applied only to one of the end facets, that is, to the end facet 32, similarly as in the optical amplifier described above with reference to FIG. 3. The effective reflection factor at the end facet 33 which is a cleave facet to which no AR coat is applied is estimated to be 5 to 10%, and the effective reflection factor at the end facet 32 to which an AR coat is applied is estimated to be 0.03 to 0.05%.

Also the optical amplifier of the present embodiment exhibits a function of an optical gate similarly to the optical amplifier of the second embodiment, and the end facet 32 side to which an AR coat is applied serves as the inputting side. An optical amplifier having the construction of the present embodiment was produced, and current of 20 mA was injected into the optical amplifier thus produced. The measurement reveals that an element gain of approximately 10 dB was obtained without depending upon input light polarization.

Meanwhile, an element which has a structure same as that of the optical amplifier of the present embodiment and has AR coats applied to both of the opposite end facets was prepared for comparison. When the noise figures were measured, the noise figure of the optical amplifier of the present embodiment exhibited a value lower than 6 dBm, and this value thus obtained is lower by more than 1 dB than that of the amplifier for comparison.

Embodiment 4

Figure 5:
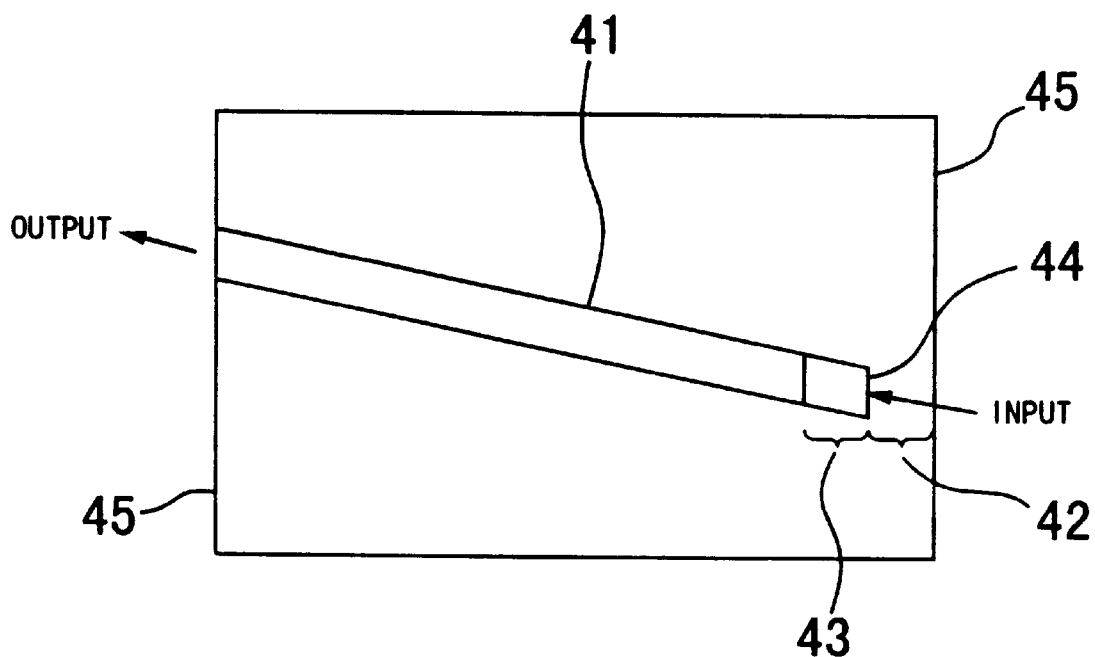

FIG. 5 is a top plan view showing a still further optical amplifier to which the present invention is applied. The present optical amplifier has a window region provided only on the optical signal inputting side of an optical waveguide.

The present optical amplifier has an inclined end facet structure wherein an active layer 41 formed between end facets 45 and 46 of the element which are opposed to each other with a distance of 500 $\mu$m left therebetween is inclined by 7 degrees with respect to the direction of a normal to the end facets of the element, and a window region 42 in which the active layer 41 is not formed extends by 25 $\mu$m from the end facet 45. Meanwhile, a taper structure 43 in which the thickness continuously varies thinner toward on tip 44 from 3,000 angstrom to 500 angstrom is formed over the length of 50 $\mu$m and in the present optical amplifier, light reflection caused by a difference in reflection factor between the optical waveguide end 44 (tip 44) and the window region 42 is much suppressed, because effective index difference between the window regior 42 and thin waveguide end 44 is so small.

The sectional structure of the present optical amplifier is a BH type LD structure same as that of the first embodiment. An AR coat of a SiON single layer film is applied to both of the opposite end facets 45. In the optical amplifier of the present embodiment, the end facet 45 side on which the window region is provided serves as the inputting side while the end facet 46 side serves as the outputting side. Where the structure described above is employed, the effective reflection factor at the end facet of the element on the inputting side is estimated to be approximately 0.001% and the effective reflection factor at the end facet of the element on the outputting side is estimated to be approximately 0.3%. An optical amplifier having the construction of the present embodiment was produced, and current of 100 mA was injected into the optical amplifier thus produced. As a result, an element gain of approximately 25 dB was obtained without depending upon input light polarization.

Meanwhile, an element which has a structure same as that of the optical amplifier of the present embodiment and has window regions formed on the opposite sides was prepared for comparison. The saturation output of the optical amplifier of the present embodiment was +6 dBm when current of 100 mA was injected, and this value thus obtained is higher by more than 3 dB than that of the amplifier for comparison. Further, the noise figure of the optical amplifier of the present embodiment in this instance exhibited a value lower than 6 dBm, and this value thus obtained is lower by more than 1 dB than that of the amplifier for comparison.

Embodiment 5

Figure 6:
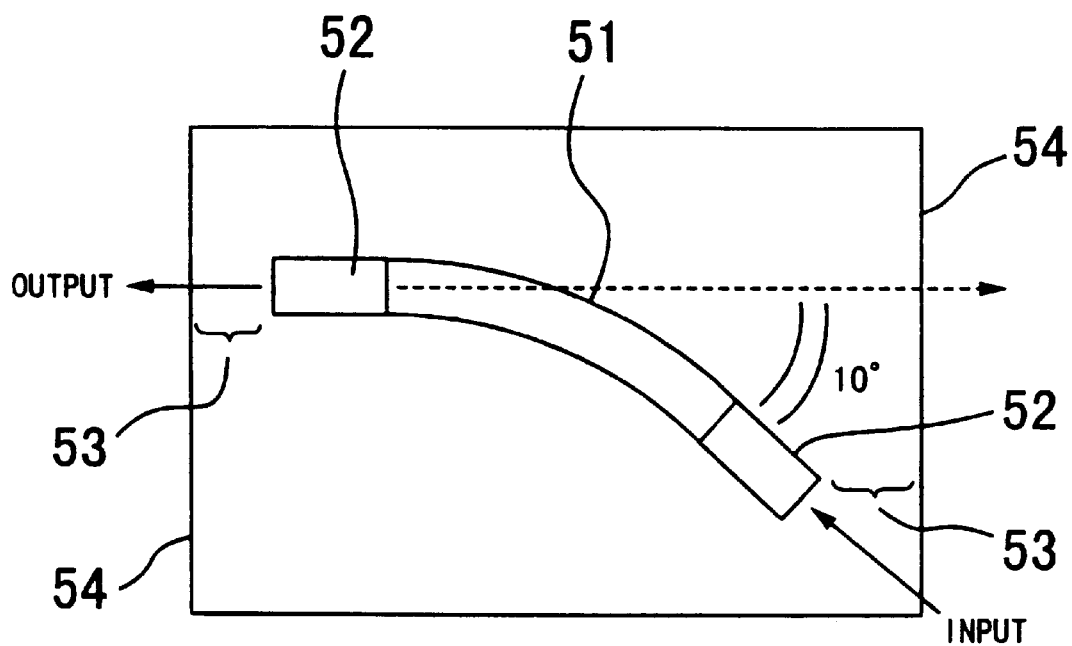

FIG. 6 is a top plan view showing a yet further optical amplifier to which the present invention is applied. In the present optical amplifier, the optical waveguide has a partial curved portion so that, when it emits light by injection of current, the emitting direction of light is inclined from the direction of a normal to an end facet of the element on the optical signal inputting side.

In the present optical amplifier, the thickness of an active layer 51 is 3,000 angstrom, and part of the optical waveguide whose core is formed from the active layer 51 is curved with a curvature of 1.5 mm so that the inclination of the optical waveguide on the inputting side with respect to a normal to the end facet of the element is 10 degrees.

In the present optical amplifier, a taper structure 52 which has a length of 200 $\mu$m and has a thickness which gradually varies from 3,000 angstrom to 500 angstrom is provided on the opposite ends of the optical waveguide, and the opposite end portions make window regions 53 of the same length of 30 $\mu$m. The sectional structure at a central portion of the element is a BH type LD structure which is same as that of the optical amplifier of the first embodiment. An AR coat of a SiON single layer film is applied to both of end facets 54. In the present optical amplifier, the oblique end facet side serves as the inputting side. The effective reflection factor on the inputting side is further reduced by the oblique end facet structure. The effective reflection factors on the outputting side and the inputting side of the present optical amplifier are approximately 0.1% and approximately 0.001%, respectively. An optical amplifier having the construction of the present embodiment was produced, and 150 mA was injected into the present optical amplifier. As a result, an element gain of approximately 30 dB was obtained without depending upon input light polarization. In this instance, the saturation output was higher than +7 dBm and the noise figure was lower than 6 dB. Thus, a saturation output higher by more than 3 dB and a noise figure lower by more than 1 dB than those of an opposite side oblique end facet optical amplifier same as the optical amplifier for comparison for the first embodiment were obtained successfully.

Embodiment 6

Figure 7:
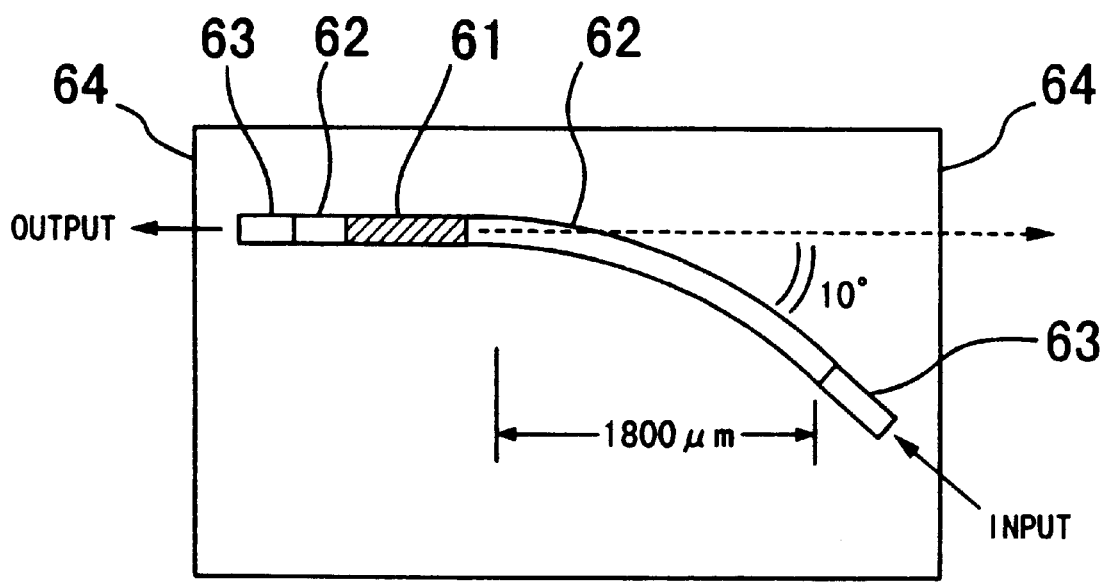

FIG. 7 is a top plan view showing a yet further optical amplifier to which the present invention is applied. The present optical amplifier is constructed such that the optical waveguide whose core layer is formed from an active layer is a striped optical waveguide and passive optical waveguides are formed at the opposite ends of the optical waveguide, and the passive optical waveguide only on the optical signal inputting side has a partial curved portion so that the emitting direction of light is inclined from the direction of a normal to an end facet of the element only on the optical signal inputting side.

In the present optical amplifier, a passive optical waveguide in which a composition layer 62 of $\lambda$=1.3 $\mu$m which has an active layer 61 of a composition of $\lambda$=1.5 $\mu$m as a core thereof is provided is formed on both of the inputting side and the outputting side of the active layer 61. The length and the thickness of the active layer 61 are 600 $\mu$m and 3,000 angstrom, respectively, and also the thickness of the composition layer 62 is 3,000 angstrom. The length of the composition layer 62 on the outputting side is 100 $\mu$m, and the length of the composition layer 62 on the inputting side regarding the direction of the normal described above is 1,800 $\mu$m. A taper structure 63 whose length is 200 $\mu$m and whose thickness gradually varies from 3,000 angstrom to 500 angstrom is provided on the opposite ends of the optical waveguide.

Only the composition layer 62 in one of the passive optical waveguides on one side, that is, on the inputting side, is curved by 10 degrees with a curvature of 10 mm, and a one-side inclined end facet structure is formed thereby. The sectional structure of the optical amplifier at the active layer 61 is a BH type LD structure which is same as in the optical amplifier of the first embodiment.

The effective reflection factors of the optical amplifier of the present embodiment on the outputting side and the inputting side are approximately 0.1% and approximately 0.0001%, respectively. An optical amplifier having the construction of the present embodiment was produced, and current of 150 mA was injected into the present embodiment. As a result, an element gain of approximately 30 dB was obtained without depending upon input light polarization. In this instance, the saturation output was more than +7 dBm and the noise figure was less than 6 dB. Thus, a saturation output higher by more than 3 dB and a noise figure lower by more than 1 dB than those of a both-side inclined end facet optical amplifier same as the optical amplifier for comparison for the first embodiment were obtained successfully.

Embodiment 7

Figure 8:
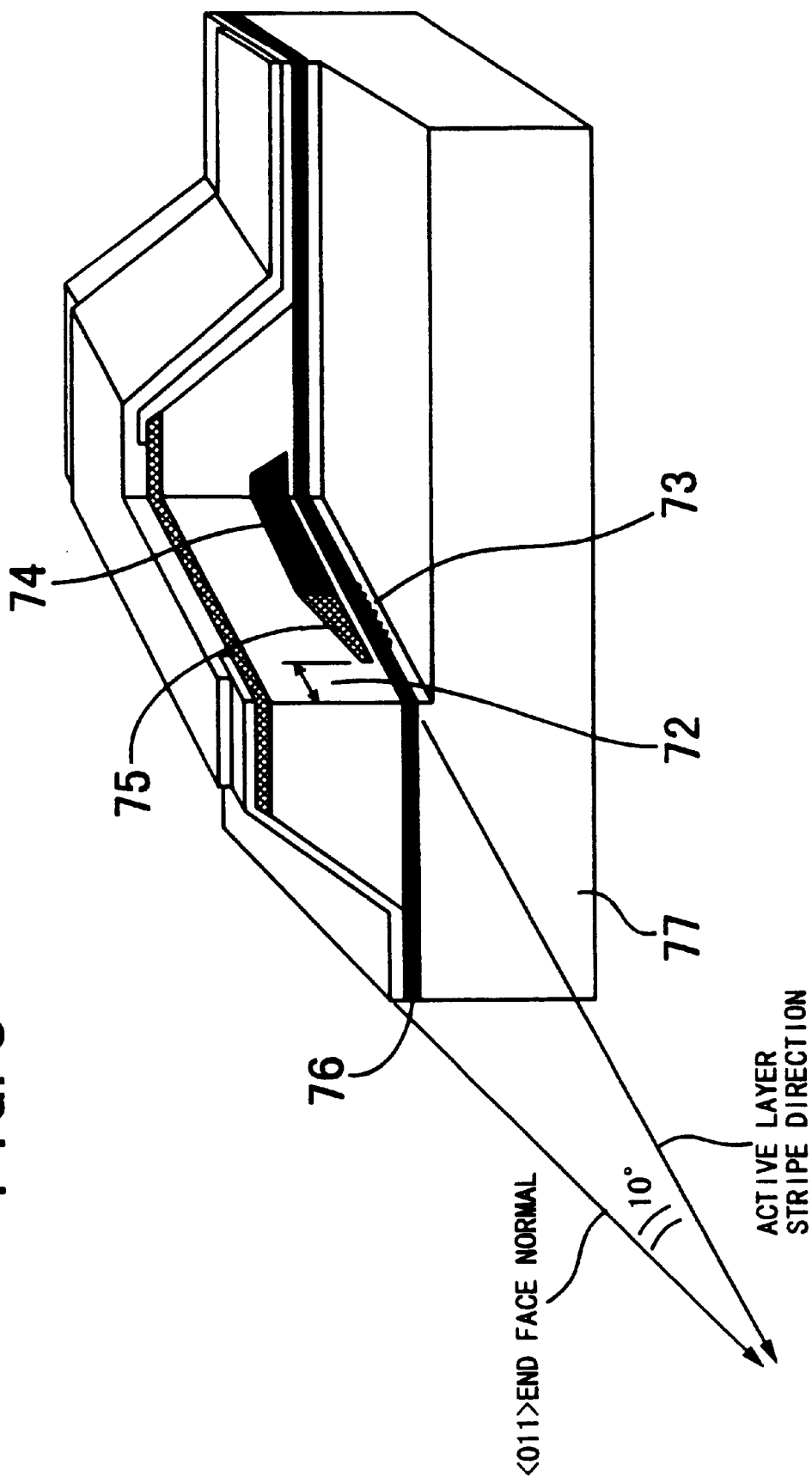
FIG. 8 is a perspective view showing a detailed structure of a further optical amplifier to which the present invention is applied.

FIG. 8 is a perspective view showing a yet further optical amplifier to which the present invention is applied and also shows a partial sectional structure. In the present optical amplifier, a grating structure which causes light reflection is formed on only the optical signal outputting side. The present optical amplifier has a basic structure similar to that of the first embodiment shown in FIG. 1, and a taper structure 75 is formed at an output end of an active layer 74 and light is outputted through a window region 72.

Both of the inputting and outputting sides of the element of the present embodiment have a similar 10-degree inclined end facet structure and have the window regions 72 provided thereon (not shown for the inputting side), and an AR coating of two layers of $TiO_2/SiO_2$ is applied to both end portions.

A grating embedding layer 76 is provided below the active layer, and a grating 73 is formed on the grating embedding layer 76 in the proximity of an end facet 77 which serves as the outputting side. The grating is not embedding on the inputting side. The effective reflection factor of the inputting side is estimated to be lower than 0.0001%. The reflection factor of the outputting side relies much upon the grating 73 and is estimated to be approximately 0.1%. An optical amplifier having the construction of the present embodiment was produced, and 150 mA was injected into the present embodiment. As a result, an element gain of approximately 30 dB was obtained without depending upon input light polarization. In this instance, the saturation output was higher than +7 dBm and the noise figure was lower than 6 dB.

An optical amplifier which has a structur similar to that of the optical amplifier of the present embodiment and has no grating formed thereon was prepared for comparison.

The noise figures were measured, and the result reveals that the noise figure of the optical amplifier of the present embodiment was, when compared with the amplifier for comparison, lower by more than 1 dB and the saturation output was higher by more than 3 dB.

Having now fully described the invention, it will be apparent to one of ordinary skill in the art that many changes and modifications can be made thereto without departing from the spirit and scope of the invention as set forth herein.

What is claimed is:

1. A semiconductor optical amplification element having an optical waveguide which includes a core layer formed from an active layer acting as an optical amplification medium and amplifies and outputs an optical signal without electrically converting the optical signal wherein a light reflection factor on an inputting side end of said element for an optical signal is lower than a light reflection factor on an outputting side end of said element, and further wherein said optical waveguide is a striped optical waveguide and is formed in an inclined relationship from a direction of a normal to an end facet of said element and besides has, in the proximity of the opposite ends of said element, window regions in which the optical waveguide structure is terminated, and the window region on the optical signal inputting side is longer by more than 20 $\mu$m than the window region on the optical signal outputting side.

2. A semiconductor amplification element as claimed in claim 1, wherein a grating structure for causing reflection of light to occur is formed only on the optical signal outputting side.

3. A semiconductor optical amplification element as claimed in claim 1, wherein said active layer comprises a taper structure such that the thickness of at least the inputting side end facet of said active layer decreases so as to form a tip.

4. A semiconductor optical amplification element as claimed in claim 1, wherein the light reflection factor on the inputting side end of said element is lower than 1/100 the light reflection factor on the outputting side end of said element.

5. A semiconductor amplification element as claimed in claim 1, wherein said optical waveguide is formed in parallel or in an inclined relationship to a direction of a normal to an end facet of said clement, and an anti-reflecting coating is provided only on the inputting side end facet of said element.

6. A semiconductor optical amplification element a having an optical waveguide which includes a core layer formed from an active layer acting as an optical amplification medium and amplifies and outputs an optical signal without electrically converting the optical signal wherein a light reflection factor on an inputting side end of said element for an optical signal is lower than a light reflection factor on an outputting side end of said element, and further comprising a window region, in which the optical waveguide structure is terminated, only in the proximity of the inputting side end of said element.

7. A semiconductor amplification element as claimed in claim 6, wherein a grating structure for causing reflection of light to occur is formed only on the optical signal outputting side.

8. A semiconductor optical amplification element as claimed in claim 6, wherein said active layer comprises a taper structure such that the thickness of at least the inputting side end facet of said active layer decreases so as to form a tip.

9. A semiconductor optical amplification element as claimed in claim 6, wherein the light reflection factor on the inputting side end of said clement is lower than 1/100 the light reflection factor on the outputting side end of said element.

10. A semiconductor amplification element as claimed in claim 6, wherein said optical waveguide is formed in parallel or in an inclined relationship to a direction of a normal to an end facet of said element, and an anti-reflecting coating is provided only on the inputting side end facet of said element.

11. A semiconductor optical amplification element having an optical waveguide which includes a core layer formed from an active layer acting as an optical amplification medium and amplifies and outputs an optical signal without electrically converting the optical signal wherein a light reflection factor on an inputting side end of said element for an optical signal is lower than a light reflection factor on an outputting side end of said element, and further wherein said optical waveguide has a partial curved portion formed thereon such that an emitting direction of light by current injection light emission is inclined from a direction of a normal to an inputting side end facet of said element.

12. A semiconductor optical amplification element as claimed in claim 11, wherein said optical waveguide has partial curved portions formed thereon such that an emitting direction of light by current injection is inclined from a direction of a normal to each end facet of said element and the inclination on the optical signal inputting side is larger than that on the optical signal outputting side.

13. A semiconductor optical amplification element as claimed in claim 11, wherein the light reflection factor on the inputting side end of said element is lower than 1/100 the light reflection factor on the outputting side end of said element.

14. A semiconductor optical amplification element having an optical waveguide which includes a core layer formed from an active layer acting as an optical amplification medium and amplifies and outputs an optical signal without electrically converting the optical signal wherein a light reflection factor on an inputting side end of said element for an optical signal is lower than a light reflection factor on an outputting side end of said element, and further wherein said optical waveguide whose core layer is formed from an active layer is striped optical waveguide and passive optical waveguides are additionally provided for the opposite ends of said optical waveguide, and the passive optical waveguide on the optical signal inputting side has a partial curved portion formed thereon such that an emitting direction of light by current injection is inclined from a direction of a normal to an end facet of said element only on the optical signal inputting side.

15. A semiconductor optical amplification element as claimed in claim 14, wherein the light reflection factor on the inputting side end of said element is lower than 1/100 the light reflection factor on the outputting side end of said element.

16. A semiconductor amplification element having an optical waveguide which includes a core layer formed from an active layer acting as an optical amplification medium and amplifies and outputs an optical signal without electrically converting the optical signal wherein a light reflection factor on an inputting side end of said element for an optical signal is lower than a light reflection factor on an outputting side end of said element, and further wherein said optical waveguide whose core layer is formed from an active layer is a striped optical waveguide and passive optical waveguides are additionally provided for the opposite ends of said optical waveguide, and the passive optical waveguide on the optical signal inputting side has a partial curved portion formed thereon such that an emitting direction of light by current injection is inclined from a direction of a normal to each end facet of said element and the inclination on the optical signal inputting side is larger than that on the optical signal outputting side.

17. A semiconductor optical amplification element as claimed in claim 16, wherein the light reflection factor on the inputting side end of said element is lower than 1/100 the light reflection factor on the outputting side end of said element.

* * * * *

UNITED STATES PATENT AND TRADEMARK OFFICE
CERTIFICATE OF CORRECTION

PATENT NO. : 6,141,477
DATED : October 31, 2000
INVENTOR(S) : Shotaro Kitamura

It is certified that error appears in the above-identified patent and that said Letters Patent is hereby corrected as shown below:

Column 7,
Line 35, delete "regior" insert -- region --

Column 10,
Line 44, delete "6" insert -- 5 --;
Line 48, delete "6" insert -- 5 --;
Line 52, delete "6" insert -- 5 --;
Line 57, delete "6" insert -- 5 --;

Column 11,
Line 8, delete "11" insert -- 6 --;
Line 15, delete "11" insert -- 6 --;

Column 12,
Line 4, delete "14" insert -- 8 --;
Line 28, delete "16" insert -- 9 --;

Signed and Sealed this

Ninth Day of October, 2001

*Attest:*

*Nicholas P. Godici*

NICHOLAS P. GODICI
*Attesting Officer*            *Acting Director of the United States Patent and Trademark Office*